United States Patent [19]

Roohparvar

[11] Patent Number: 5,682,496
[45] Date of Patent: Oct. 28, 1997

[54] FILTERED SERIAL EVENT CONTROLLED COMMAND PORT FOR MEMORY

[75] Inventor: Frankie Fariborz Roohparvar, Cupertino, Calif.

[73] Assignee: Micron Quantum Devices, Inc., Santa Clara, Calif.

[21] Appl. No.: 386,688

[22] Filed: Feb. 10, 1995

[51] Int. Cl.⁶ ................................................ G11C 16/06
[52] U.S. Cl. ............... 395/430; 364/965.76; 364/965.79
[58] Field of Search ................................ 395/430, 494; 365/208, 212, 220, 221; 364/965.76, 965.79; 327/14; 326/93

[56] References Cited

U.S. PATENT DOCUMENTS

| | | | |
|---|---|---|---|
| 4,223,394 | 9/1980 | Pathak et al. | 365/185.21 |
| 4,606,052 | 8/1986 | Hirzel et al. | 375/333 |
| 5,053,990 | 10/1991 | Kreifels et al. | 395/430 |
| 5,222,046 | 6/1993 | Kreifels et al. | 365/185.22 |
| 5,222,076 | 6/1993 | Ng et al. | 375/223 |
| 5,306,963 | 4/1994 | Leak et al. | 327/14 |
| 5,414,829 | 5/1995 | Fandrich et al. | 395/428 |
| 5,463,757 | 10/1995 | Fandrich et al. | 395/430 |
| 5,504,441 | 4/1996 | Sigal | 326/93 |
| 5,509,134 | 4/1996 | Fandrich et al. | 395/430 |
| 5,513,333 | 4/1996 | Kynett et al. | 395/430 |

FOREIGN PATENT DOCUMENTS

| | | |
|---|---|---|
| 377 841 | 7/1990 | European Pat. Off. |
| 2 215156 | 9/1989 | United Kingdom . |

OTHER PUBLICATIONS

Kynett, Virgil Niles, et al., "An In-System Reprogrammable 32K×8 CMOS Flash Memory," IEEE Journal of Solid-State Circuits, V23, N5, Oct. 1988.

Primary Examiner—Tod R. Swann
Assistant Examiner—Keith W. Saunders
Attorney, Agent, or Firm—Schwegman, Lundberg, Woessner & Kluth, P.A.

[57] ABSTRACT

A filtered command port architecture for a memory array is disclosed. A command controller is directly connected to the memory array and receives command instructions from an external microprocessor via an address and data bus. A command clock is used to latch commands from the data bus into a command decoder. A timing signal is used to filter incoming signals from the data bus which are asserted for less than a predetermined amount of time. A state decoder then tracks a sequence of commands from the command decoder and performs an appropriate action in response to the commands.

9 Claims, 4 Drawing Sheets cessor chip, random access memory, and non-volatile memory. Non-volatile memory is memory that retains its previously stored information even when power is no longer supplied to the chip. One type of non-volatile memory is read-only flash memory, which can be erased electrically rather than by exposure to ultra-violet light. Read-only flash memories are also electrically programmable.

FILTERED SERIAL EVENT CONTROLLED COMMAND PORT FOR MEMORY

FIELD OF THE INVENTION

The present invention generally relates to the field of electrically programmable and electrically erasable read-only memory, and more particularly to a filtered serial-event-controlled command port for a flash memory device.

BACKGROUND OF THE INVENTION

The power and flexibility of personal computers have increased dramatically since their introduction in the marketplace. As a result, the use of computers has risen significantly and has had a tremendous impact in society. In essence, personal computers typically comprise a microprocessor chip, random access memory, and non-volatile memory. Non-volatile memory is memory that retains its previously stored information even when power is no longer supplied to the chip. One type of non-volatile memory is read-only flash memory, which can be erased electrically rather than by exposure to ultra-violet light. Read-only flash memories are also electrically programmable.

A variety of conceived memory-command interfaces has simplified reading and writing information to non-volatile memories coupled to microprocessors. With such an interface, a microprocessor can issue a command such as "erase" or "program" through data lines connecting the microprocessor to the memory chip. The chip typically contains logic circuitry for decoding and executing these commands.

The prior art employs different methods for implementing this logic circuitry. FIG. 1 depicts an example of one implementation, disclosed in U.S. Pat. No. 5,222,046. To request the execution of a command, the control lines of the microprocessor externally generates an asynchronous clock signal by bringing lines CE and WE low. Typically, a clock signal lasts approximately 50 nanoseconds (ns), and the time between successive clock signals is even shorter, approaching 10 nanoseconds (ns).

Such a short duration, however, can potentially disrupt the logic circuitry of a memory device from properly executing a desired command. Typically, data latches into the command and state registers incident to the externally generated asynchronous clock signal. The state decoder block then decodes the output of the registers and directs execution of the proper command. However, the parasitic capacitance associated with the chip typically delays movement of data through the data bus to the registers. Before the data reaches the registers, the microprocessor may generate another clock signal asking for a second command to be performed on different data. Potentially, this may confuse the decoder block, causing it to direct execution of the second command on the wrong data, and to fail to execute the first command.

For example, the microprocessor may request execution of a first command on a first data. The state decoder block will receive this command, and begin waiting for the first data to move through the data bus to the state and command registers. Before the data reaches the registers, however, the microprocessor may request execution of a second command on a second data. The decoder block may receive this second command before the first data has reached the registers. When the first data does arrive, the block will direct execution of the second command on the first data, thus directing performance of the wrong command on the first data. Therefore, a drawback to the approach employed by the prior art is that extreme care must be taken in designing a non-volatile memory device chip so as to prevent this problem from occurring.

It should be noted, however, that typically once a command is received by the command architecture, it latches therein such that subsequent data received by the architecture will have the last received command performed upon it. For example, in the sequence COMMAND-DATA1-DATA2, both DATA1 and DATA2 will have COMMAND performed upon them. In other words, each sent data does not require a separate sent command—the command COMMAND-DATA1-COMMAND-DATA2 is not necessary, for example, to perform COMMAND on both DATA1 and DATA2. Furthermore, where the command architecture has initially powered up and no command has yet been sent to it, typically the default command in such an instance is a read command.

This parallel approach to command architecture also poses a problem because of the simultaneous nature of the command and state processing inherent in a parallel approach. The state register must read and process data off the bus concurrent to the command register reading and processing a command off the bus. The registers must output to the state decoder block the results of their processing nearly simultaneously, or the state decoder will not direct execution of the command upon the data correctly. In using a non-volatile memory employing the prior art approach to command architecture, a designer must take proper precaution to avoid this situation from occurring.

In addition, the approach taken by the prior art is highly sensitive to noise on the WE and CE lines. The internal logic circuitry of a non-volatile memory device may potentially perceive even a brief burst of simultaneous noise on the WE and CE lines as an asynchronous clock signal generated externally by the microprocessor. This would erroneously cause the state and command registers to latch, and the state decoder block to decode. The decoder block would then direct execution of a command upon data in the device that the microprocessor had not actually requested. Therefore, a drawback to the approach employed by the prior art is that it is vulnerable to noise on the CE and WE lines inciting erroneous commands to be executed upon data in the memory device.

This problem is exasperated in many systems where the CE line is typically tied low. Noise on the WE line is then sufficient to incite erroneous execution of a command. A command architecture might divide execution of an erase command into two parts: an erase-setup command for directing the command to occur, and an erase-confirm command for verifying that the command has executed. Even if the erase-setup command executes properly, noise on the WE line before the command register has received the erase-confirm command will frustrate proper execution of the operation. This is because after handling the erase-setup command, the state register expects to receive a erase-confirm command. When it does not, it signals an error, even if the next command on the bus is a erase-confirm command. A prior-art memory device operating in such a noisy environment may thus encounter curtailed performance.

SUMMARY OF THE INVENTION

The present invention provides a circuit to filter any signals asserted on lines WE and CE less than a predetermined duration, and to execute processing of a command and state within the command architecture in a serial manner. The invention eliminates the potential for the state block decoder to direct execution of a wrong command because the duration is necessarily longer than the delay in data moving through the data bus to the register. The invention also eliminates the potential for erroneous execution because a single register handles both data and command information off the bus, processing it in a serial manner. Further, the invention eliminates vulnerability to noise that may cause the decoder to direct execution of an erroneous command, because typically such noise is shorter in duration than that which the invention allows to pass.

These and other advantages and features that characterize the present invention are described with particularity in the claims appended hereto and forming a further part hereto. For better understanding of the invention, its advantages and objectives, reference should be made to the drawings, which form a further part hereto, and to the accompanying descriptive matter, which illustrates and describes a preferred embodiment of the present invention.

DETAILED DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention. For instance, the present invention has application in connection with non-volatile erasable programmable read-only memory (EPROM) and electrically erasable programmable read-only memory (EEPROM) chips. In addition, the circuits for filtering incoming commands from an external microprocessor may be implemented using various forms of active or passive circuits, and the respective circuits providing the input and output signals to the state decoder may be implemented in a number of modified forms. The preferred circuits depicted in FIG. 2 show an exemplary arrangement and use a filtering means in accordance with the present invention, but it should be recognized that other circuits may be implemented within the scope of the present invention without loss of generality.

Figure 2:
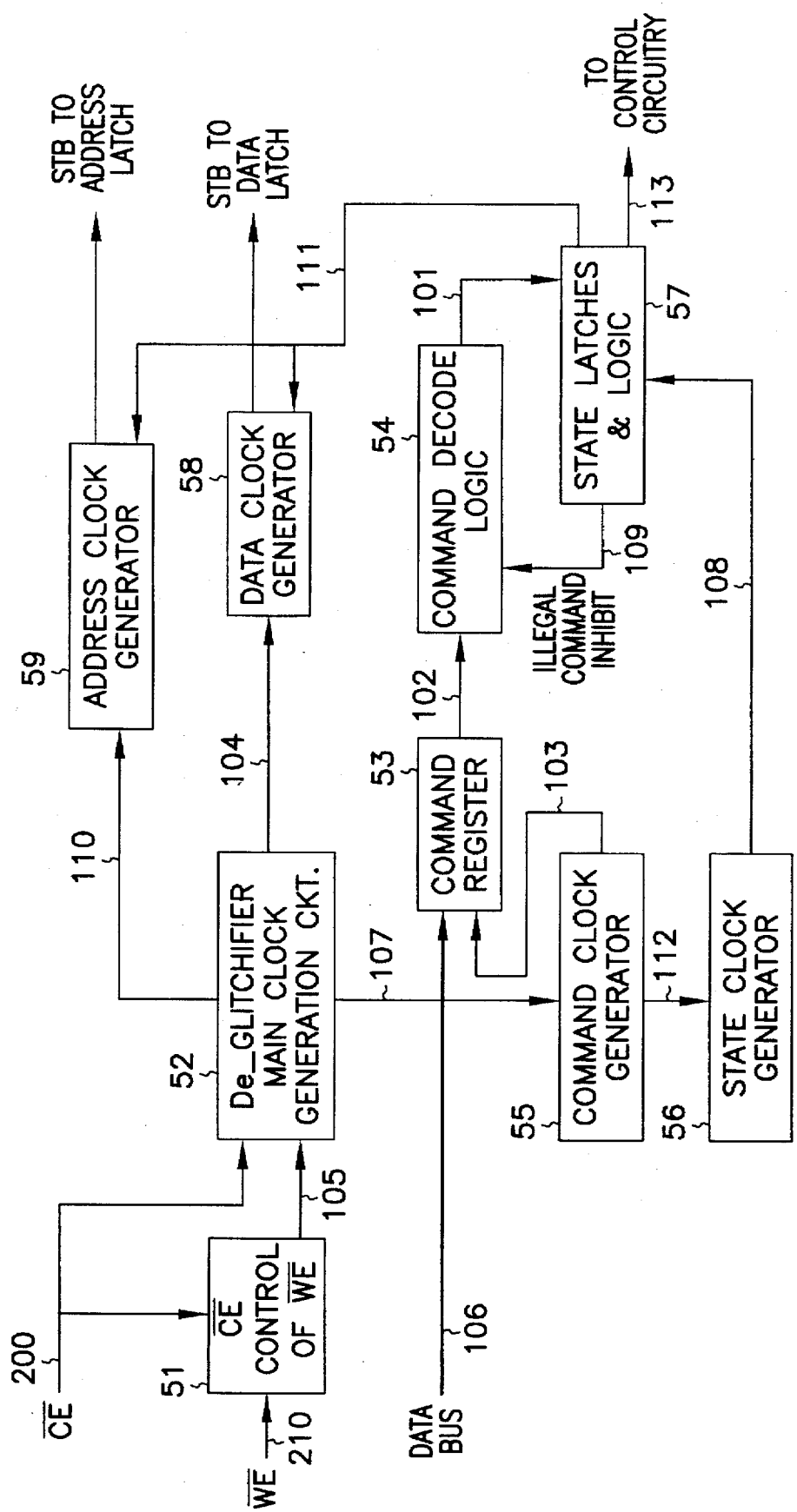
FIG. 2 is a block diagram of a filtered command port architecture compatible with the present invention.

FIG. 2 describes a typical filtered command port architecture which may be used with the present invention. External signal lines WE and CE 210 and 200 are coupled to a block 51. When WE and CE line signals 210 and 200 are low, a signal 105 is asserted signifying the existence of legal conditions for a command or data load instruction. Signal 105 is then coupled to a main clock generator circuit 52. If the duration of signal 105 is less than a predetermined filter duration, the signal is prevented from continuing, and none of the outputs of main clock generator circuit 52 are asserted.

The invention takes a new and novel approach to interpreting the command cycling commonly used by non-volatile memory devices. A typical specification for a non-volatile memory device stipulates the assertion of a command for 50 nanoseconds (ns), followed by a period of "dead" time lasting 10 ns. Whereas the prior art incites simultaneous latching of the state and command registers immediately upon the beginning of a new cycle, the invention first delays any latching by 20 ns while a clock generation circuit 52 ensures that the assertion of the WE and CE lines 210 and 200 is not due to noise. In the remaining 30 ns of the cycle, a command register 53 first reads the command off the data bus and processes it. The same register then reads the data off the bus and processes it. Therefore, the present invention effectively reapportions the typical 60 ns clock cycle consisting of 50 ns command-assertion time and 10 ns "dead" time into a command-assertion time of 30 ns and "dead" time of 30 ns. The 20 ns increase in "dead" time results from the delay imposed by the filtering effect of clock generator circuit 52.

Figure 3:
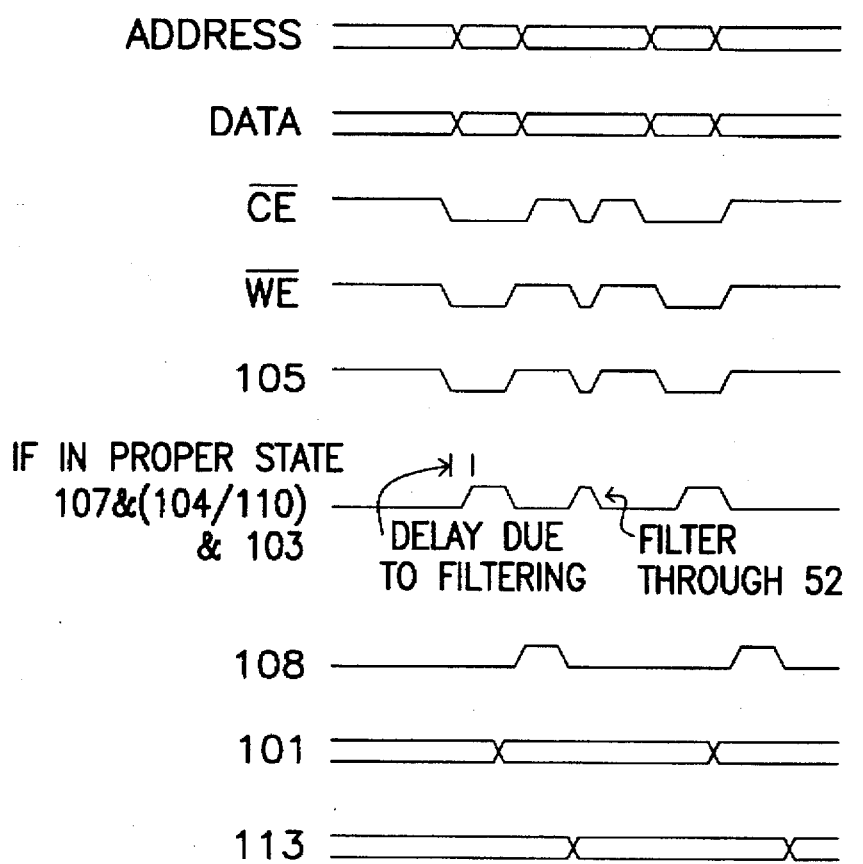
FIG. 3 is a timing diagram showing the operation of the filtered command port architecture shown in FIG. 2.

FIG. 3 describes a typical timing diagram of a filtered command signal which may be used with the present invention. When an externally provided command or data signal is filtered, the high going edge of clock signals 107, 104 and 110 are delayed by the same amount as the predetermined filter duration, typically 20 ns. With further reference to FIG. 2, signal 107 is then typically coupled to a command clock generator 55 which in turn generates signal 103. Signal 103 is coupled to command register 53, which is used to latch commands placed on a data bus 106 into command register 53. A signal 102 represents the typical output of command register 53, and is normally coupled to a command decode logic circuit 54 and a state latches and logic 57 through a signal 109. Signal 109 represents the current state of the state machine interpreting commands and executing instructions in the memory array. State latches and logic 57 will consider some legal commands as illegal if they are received out of sequence, depending on the current state.

FIG. 2 also depicts command decode logic 54 being coupled to command register 53 and state latches and logic 57, and generating an appropriate legal code 101. Command decode logic 54 decodes the signal received as signal 102, only if the current state does not prohibit the command for being out of sequence or some other reason. For example, a hexadecimal code 0×90h represents a read intelligent identifier command instruction. If this code is received during a normal read sequence, the output of command decode logic 54 is asserted to signal the control circuitry via a line 113 to perform the necessary tasks for the command. However, if the same code is received in the middle of a program cycle, command decode logic 54 detects that the code is not valid during the program cycle operation, and the output of command decode logic 54 will not assert the signal for the operation.

A state clock generator 56 is coupled to command clock generator 55 through a line 112. On a high going edge of either CE or WE, a line 105 will typically be deasserted, and as a result signals 107, 104 and 110 will also typically be deasserted. Upon the deassertion of line 107, a line 112 is asserted and state clock generator 56 is activated. Upon activation, state clock generator 56 generates a pulse on a line 108 of a predetermined duration. State latches and logic 57 are coupled to state clock generator 56 through line 108. Because of the serial clocking nature of lines 103 and 108, and the fact that by the time line 108 is asserted, a line 101 is valid, state latches and logic 57 does not need to be coupled to the data bus as described in prior art inventions. Instead, the state is received off data bus 106 by command register 53. State latches and logic 57, depending upon the low going edge of line 108, the current state, and the valid decoded command on line 101, transitions to the next appropriate state. The control logic of the chip is coupled to state latches and logic 57 through line 113. A state transition is reflected on line 113, and the control logic generates the necessary signals to effect the change of state.

State latches and logic 57 is also typically coupled to an address clock generator 59 and a data clock generator 58 through a line 111. Address clock generator 59 and data chock generator 58 are further normally coupled to clock generator circuit 52 through lines 110 and 104. Upon receiving a signal from lines 110 and 104, address clock generator 59 and data clock generator 58, depending on line 111 which signifies whether latching of address and data is necessary, send strobe timing signals to address and data latches.

In the preferred embodiments of the present invention, any pulses shorter than 20 ns are filtered. This enables the memory array to work in noisy systems. It will be recognized that other durations may be substituted for the 20 ns duration in the present system without loss of generality. In a specific memory array which embodies the present invention, the memory array operates at a cycle time of 60 ns, of which 50 ns is the amount of the time that CE or WE is typically held low. This leaves state clock generator 56 only 10 ns to latch a signal on line 108, which is typically not sufficient for reliable operation. However, the present invention provides clock generator circuit 52, which delays the output signal on line 107 by 20 ns. This 20 ns delay, when added to the existing 10 ns time period, provides a latch duration of 30 ns, which is normally sufficient for reliable operation.

Figure 1:
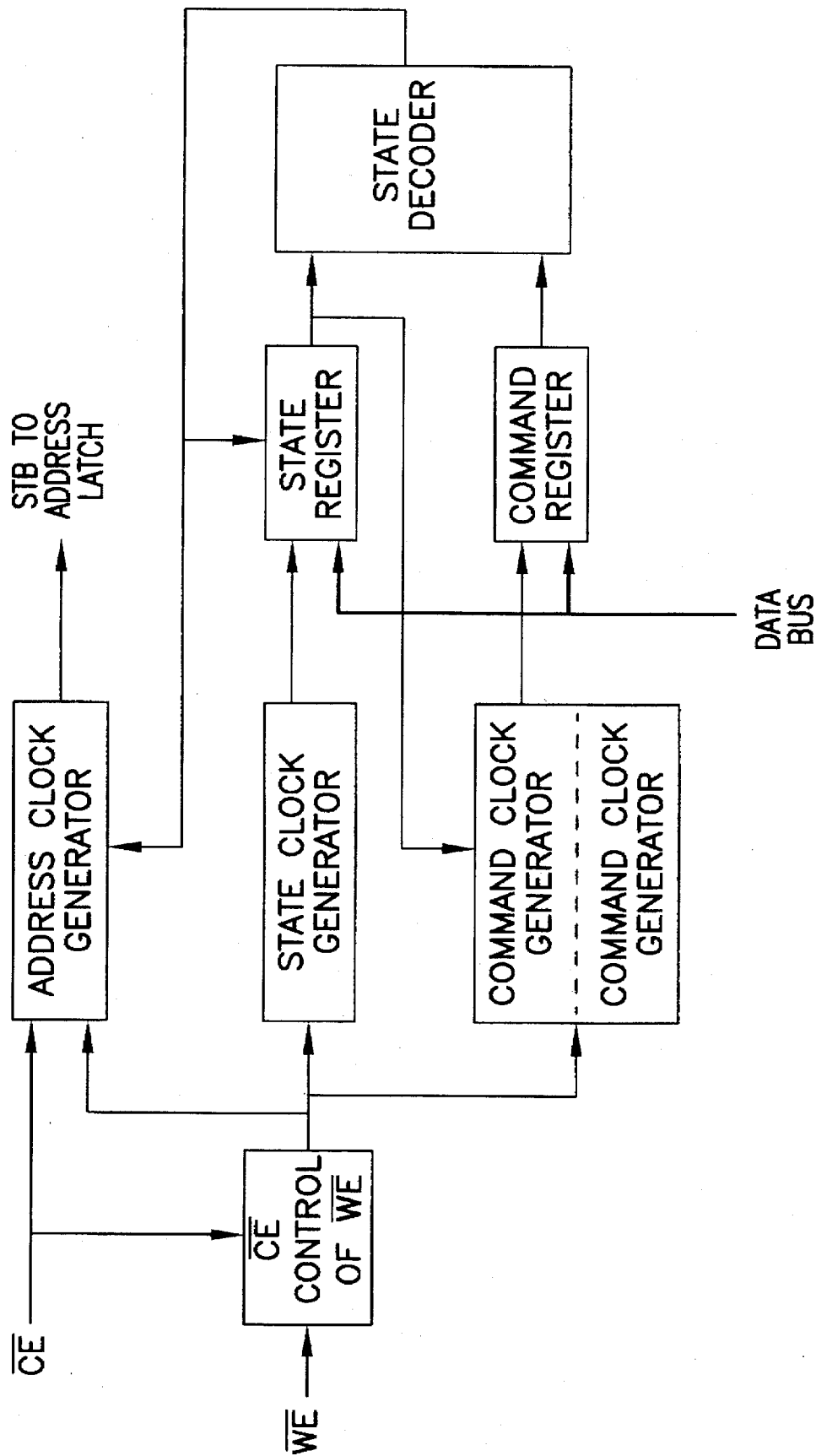
FIG. 1 is a block diagram showing a prior art command interface means for flash memory.

This present invention is able to turn the parallel design approach of the prior art, as described in FIG. 1, into a serial event driven command port architecture, as shown in FIG. 2. This results directly from the incorporation of the glitch filter implemented in clock generator circuit 52. The present invention eliminates the need to couple the data bus directly to the state machine, and also eliminates incorrect opcodes, or commands, before they are received by state latches and logic 57. Because it is known that incorrect or invalid opcodes, or commands, are eliminated before reaching the state machine, the design of the state machine can be simplified.

Figure 4:
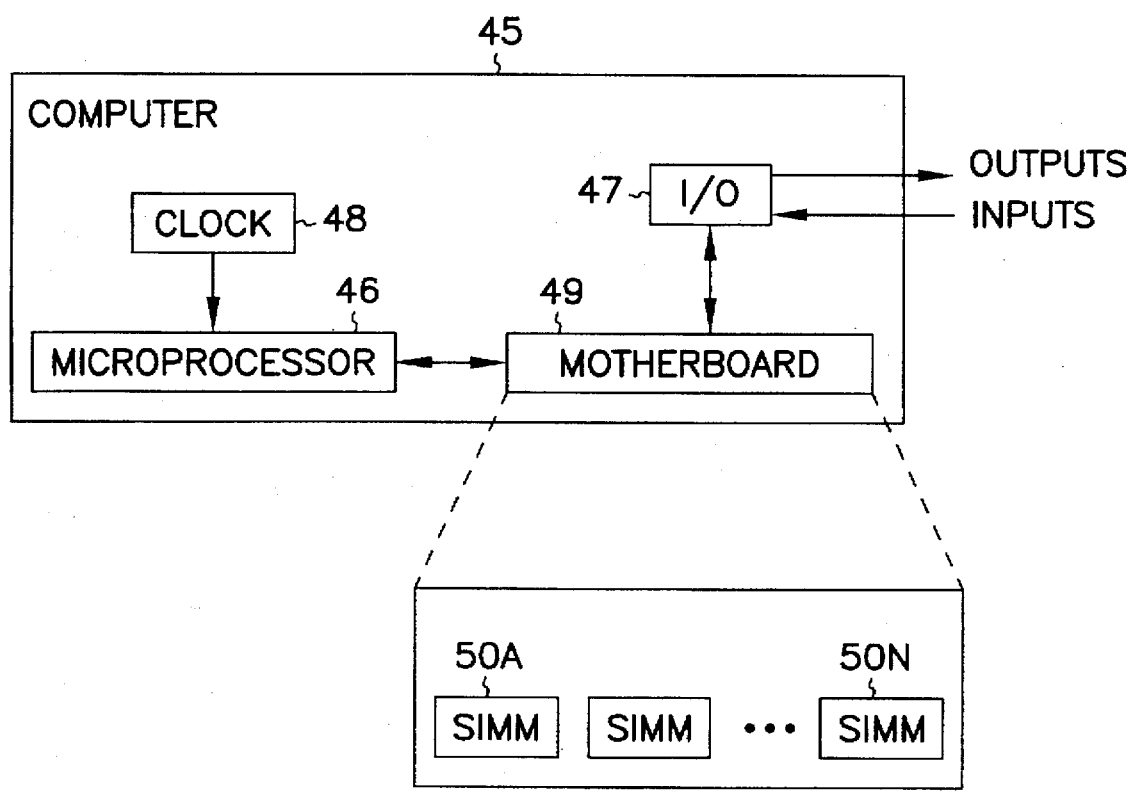
FIG. 4 is a block diagram of a typical computer that may incorporate the present invention.

FIG. 4 is a block diagram of an exemplary computer 45 that may incorporate the present invention. The computer 45 includes a microprocessor 46 and corresponding clock 48. The microprocessor 46 contains the central processing unit (CPU) and associated control circuitry. The microprocessor 46 is connected to a motherboard 49. An I/O interface module 47 is connected to the motherboard 49 and interfaces the microprocessor 46 with peripheral devices such as a monitor and printer. The motherboard 49 also contains a plurality of memory modules for storing data, such as single in-line memory modules (SIMMs) 50A–50N. The motherboard 49 is typically implement with a printed circuit board, and the SIMMs 50A–50N are typically implemented with integrated circuit chips which "plug into" the motherboard 49. A non-volatile memory is usually used on the motherboard 49, SIMMs 50A–50N, or through the I/O interface module 47.

The foregoing description, which has been disclosed by way of the above examples and discussion, addresses preferred embodiments of the present invention encompassing the principles of the present invention. The embodiments may be changed, modified, or implemented using various circuit types and arrangements. Those skilled in the art will readily recognize that modifications and changes may be made to the present invention without strictly following the exemplary embodiments and applications illustrated and described herein, without departing from the true spirit and scope of the present invention which is set forth in the following claims.

What is claimed is:

1. A memory access arrangement for an electrically erasable and programmable memory having a memory array composed of a number of selectively ordered floating gate memory devices, comprising:

a data bus constructed and arranged to carry coded digital signals;

a clock generation circuit constructed and arranged to generate first and second clock signals having leading edge and trailing edge state transitions, wherein the first clock leading edge state transitions are responsive to at least one control signal being activated but the first clock leading edge state transitions are delayed by a delay duration and the first clock leading edge state transitions are generated only if the at least one control signal is activated for at least the delay duration, and wherein the second clock leading edge state transitions are responsive to the first clock trailing edge state transitions, and wherein a defined cycle time duration is from one first clock leading edge state transition to the next occurring second clock trailing edge state transition such that the delay duration does not reduce the defined cycle time duration but effectively decreases the time from first clock leading edge to trailing edge state transitions and effectively increases the time from second clock leading edge to trailing edge state transitions;

a first latch circuit including a command register arranged to latch a memory command signal from the data bus into the command register in response to the first clock signal; and a second latch circuit including a state register arranged to latch a memory state signal from the command register which latches one of the memory-access state signals into the state register in response to the second clock signal.

2. A memory access arrangement, according to claim 1, wherein the clock generation circuit filters noise having active durations less than the delay duration.

3. A memory access arrangement, according to claim 1, wherein the delay duration represents a significant portion of the defined cycle time duration.

4. A memory access arrangement, according to claim 3, wherein the delay duration is about one third of the cycle time duration.

5. A memory access arrangement, according to claim 3, wherein the defined cycle time duration is about 60 nanoseconds and the delay duration is not substantially less than 20 nanoseconds.

6. A memory access arrangement, according to claim 1, wherein the first latch circuit has an output arranged to couple the state signals from the command register to the second latch circuit independent of the data bus.

7. A method of accessing an electrically erasable and programmable memory having a data bus port and a memory array composed of a number of selectively ordered floating gate memory devices, the method comprising:

generating first and second clock signals having leading edge and trailing edge state transitions, wherein the first clock leading edge state transitions are responsive to at least one control signal being activated but the first clock leading edge state transitions are delayed by a delay duration and the first clock leading edge state transitions are generated only if the at least one control signal is activated for at least the delay duration, and wherein the second clock leading edge state transitions are responsive to the first clock trailing edge state transitions, and wherein a defined cycle time duration is from one first clock leading edge state transition to the next occurring second clock trailing edge state transition such that the delay duration does not reduce the defined cycle time duration but effectively decreases the time from first clock leading edge to trailing edge state transitions and effectively increases the time from second clock leading edge to trailing edge state transitions;

providing a first latch circuit including a command register, and a second latch circuit including a state register;

latching a memory-access command signal from the data bus into the command register in response to the first clock signal; and latching a memory-access state signal from the command register into the state register in response to the second clock signal.

8. A computer circuit, comprising:

a microprocessor having a defined cycle time duration;

an I/O interface module;

an electrically erasable and programmable memory having a memory array composed of a number of selectively ordered floating gate memory devices;

a data bus constructed and arranged to carry coded digital signals;

a clock generation circuit constructed and arranged to generate first and second clock signals having leading edge and trailing edge state transitions, wherein the first clock leading edge state transitions are responsive to at least one control signal being activated but the first clock leading edge state transitions are delayed by a delay duration and the first clock leading edge state transitions are generated only if the at least one control signal is activated for at least the delay duration, and wherein the second clock leading edge state transitions are responsive to the first clock trailing edge state transitions, and wherein a defined cycle time duration is from one first clock leading edge state transition to the next occurring second clock trailing edge state transition such that the delay duration does not reduce the defined cycle time duration but effectively decreases the time from first clock leading edge to trailing edge state transitions and effectively increases the time from second clock leading edge to trailing edge state transitions;

a first latch circuit including a command register arranged to latch a memory command signal from the data bus into the command register in response to the first clock signal; and a second latch circuit, including a state register arranged to receive state signals from the command register, which latches a memory state signal into the state register in response to the second clock signal.

9. A computer circuit, according to claim 8, wherein the first latch circuit is susceptible to noise causing a false latching of the memory command signal into the command register, and the delay duration of the first clock signal is selected to inhibit said false latching such that the clock generation circuit filters noise having active durations less than the delay duration.

* * * * *